United States Patent
Sung et al.

(10) Patent No.: US 7,535,091 B2
(45) Date of Patent: May 19, 2009

(54) MULTICHIP STACKING STRUCTURE

(75) Inventors: Chien-Chih Sung, Taichung (TW); Chung-Pao Wang, Taichung (TW); Yung-Chuan Ku, Taichung Hsien (TW)

(73) Assignee: Siliconware Precision Industries Co., Ltd. (TW)

(*) Notice: Subject to any disclaimer, the term of this patent is extended or adjusted under 35 U.S.C. 154(b) by 0 days.

(21) Appl. No.: 11/411,364

(22) Filed: Apr. 25, 2006

(65) Prior Publication Data

US 2007/0132084 A1    Jun. 14, 2007

(30) Foreign Application Priority Data

Nov. 22, 2005    (TW) .............. 94140899 A

(51) Int. Cl.
   *H01L 23/02* (2006.01)
(52) U.S. Cl. .................... 257/686; 438/109
(58) Field of Classification Search ........... 257/686, 257/685, 678, 777; 438/109
   See application file for complete search history.

(56) References Cited

U.S. PATENT DOCUMENTS

| | | | | |
|---|---|---|---|---|
| 5,373,189 A | * | 12/1994 | Massit et al. ............. | 257/686 |
| 6,664,643 B2 | * | 12/2003 | Emoto ...................... | 257/777 |
| 6,861,764 B2 | * | 3/2005 | Sato et al. ................. | 257/797 |
| 6,900,528 B2 | * | 5/2005 | Mess et al. ............... | 257/686 |
| 2001/0038166 A1 | * | 11/2001 | Weber .................. | 264/272.15 |
| 2005/0253247 A1 | * | 11/2005 | Imoto et al. ............. | 257/700 |
| 2006/0267173 A1 | * | 11/2006 | Takiar et al. ............ | 257/686 |

* cited by examiner

*Primary Examiner*—W. David Coleman
*Assistant Examiner*—Sonya D McCall Shepard
(74) *Attorney, Agent, or Firm*—Peter F. Corless; Steven M. Jensen; Edwards Angell Palmer & Dodge LLP

(57) ABSTRACT

A multichip stacking structure is provided, including a chip carrier; a plurality of semiconductor chips stacked on the chip carrier in a stepped manner that an overlying chip mounted on an underlying chip of the plurality of semiconductor chips has a suspended portion free of being in contact with the underlying chip; and a bump mounted on the chip carrier at a position corresponding to a suspended side of the stacked semiconductor chips where the suspended portion of the overlying chip is located. The bump can serve as a blocking member or a filling member to prevent the semiconductor chips from delamination or formation of voids during a molding process.

10 Claims, 3 Drawing Sheets

MULTICHIP STACKING STRUCTURE

FIELD OF THE INVENTION

The present invention relates to multichip stacking structures, and more particularly, to a structure of stacking a plurality of chips each having bond pads at a single side thereof.

BACKGROUND OF THE INVENTION

In order to enhance the performance and capacity of a single semiconductor package to be suitably used in a miniaturized high-speed electronic product, Multichip Module incorporating two or more semiconductor chips into a single package has been developed, which desirably has a reduced size and improved electrical functionality. The multichip module is further advantageous of minimizing a limitation of the system operation speed and shortening a transmission path between the semiconductor chips to thereby reduce signal delay and access time.

A common structure of multichip module employs side-by-side arrangement having the two or more chips mounted side-by-side on a surface of a substrate. However, as the area of the substrate must be increased when the number of chips is increased, the side-by-side arrangement is undesirably cost-ineffective to implement.

Accordingly, a method of stacking the chips has been proposed, and the stacking arrangement of chips can vary with the design of chips and the way of performing a wire-bonding process. For example, when using chips each having bond pads disposed at one side thereof, such as flash memory chips, the chips should be stacked in a step-like manner as to expose the side having the bond pads of each of the chips such that the wire-bonding process can subsequently be performed on the chips.

Referring to FIG. 1, a multichip stacking structure disclosed by U.S. Pat. No. 6,900,528 is formed by stacking a plurality of chips on a chip carrier 10. A first chip 11 is mounted on the chip carrier 10, and a second chip 12 is stacked on the first chip 11 without covering bond pads 110 of the first chip 11; similarly, a third chip 13 is stacked on the second chip 12 without covering bond pads 120 of the second chip 12, such that a step-like multichip stacking structure is formed and the wire-bonding process can be performed to electrically connect the first, second and third chips 11, 12, 13 to the chip carrier 10 via a plurality of bonding wires 14. The step-like stacking arrangement advantageously does not interfere with the wire-bonding process performed on the bond pads 110, 120 of the first and second chips 11, 12.

The foregoing step-like multichip stacking structure can save more space on the chip carrier as compared to the side-by-side multichip mounting arrangement. The step-like multichip stacking structure is further advantageous of accelerating the fabrication processes by performing the wire-bonding process in one stage after all the chips are stacked on the chip carrier and forming an encapsulant for encapsulating the stacked chips and bonding wires through a molding process. However, due to the provision of bonding wires, a mold gate G in the molding process must be made to allow a mold flow of an encapsulating resin injected through the mold gate G to have a direction parallel with the bonding wires, for example as shown in FIG. 2A or 2B. In FIG. 2A, the mold gate G is located relatively distant from the bonding wires, and in FIG. 2B, the mold gate G is located relatively close to the bonding wires.

However, as shown in the FIG. 2A, with the mold gate G being located relatively distant from the bonding wires, the encapsulating resin, which is injected through the mold gate G to form the encapsulant for encapsulating the stacked chips on the chip carrier, would provide direct impact on the overlying chip and easily makes the overlying chip delaminated from the underlying chip (as indicated by dotted lines).

On the other hand, as shown in FIG. 2B, during the molding process where the mold gate G is located relatively close to the bonding wires, the encapsulating resin injected through the mold gate G may easily have voids formed at positions corresponding to suspended portions of the stacked chips due to backflow of the encapsulating resin, thereby leading to a popcorn effect in subsequent thermal cycle and reliability test and degrading the quality of the package product.

Therefore, the problem to be solved here is to provide a multichip stacking structure, which can eliminate the problems of void formation and chip delamination during the molding process.

SUMMARY OF THE INVENTION

In light of the foregoing drawbacks in the prior art, an objective of the present invention is to provide a multichip stacking structure for preventing chip delamination due to impact of a mold flow during a molding process.

Another objective of the present invention is to provide a multichip stacking structure for preventing formation of voids in a molding process.

In order to achieve the foregoing and other objectives, the present invention proposes a multichip stacking structure comprising a chip carrier; a plurality of semiconductor chips stacked on the chip carrier in a stepped manner that an overlying chip mounted on an underlying chip of the plurality of semiconductor chips has a suspended portion free of being in contact with the underlying chip; and a bump mounted on the chip carrier at a position corresponding to a suspended side of the stacked semiconductor chips where the suspended portion of the overlying chip is located. Each of the semiconductor chips has bond pads formed at a single side thereof, and the semiconductor chips are stacked in the stepped manner that the overlying chip does not cover the bond pads of the underlying chip, thereby not interfering with a wire-bonding process to be performed on the semiconductor chips, such that the semiconductor chips can be electrically connected to the chip carrier via a plurality of bonding wires bonded to the bond pads by performing the wire-bonding process.

With provision of the bump on the chip carrier at the position corresponding to the suspended side of the stacked semiconductor chips, during a molding process where a mold gate is made to allow a mold flow of an encapsulating resin injected through the mold gate to have a direction parallel to the bonding wires and is located relatively close to the bonding wires, the bump acts as a filling member to prevent voids from being formed in the encapsulating resin at positions corresponding to the suspended portion of the overlying chip. On the other hand, when the mold gate is located relatively distant from the bonding wires, the bump acts as a blocking member to prevent the mold flow from providing direct impact on the stacked semiconductor chips and thereby eliminate chip delamination.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Preferred embodiments of a multichip stacking structure proposed in the present invention are described as follows with reference to FIGS. 3 and 4. It should be noted that the drawings are simplified schematic diagrams only showing elements relating to the present invention, and the arrangement of elements could be more complex in practical implementation.

Figure 1:
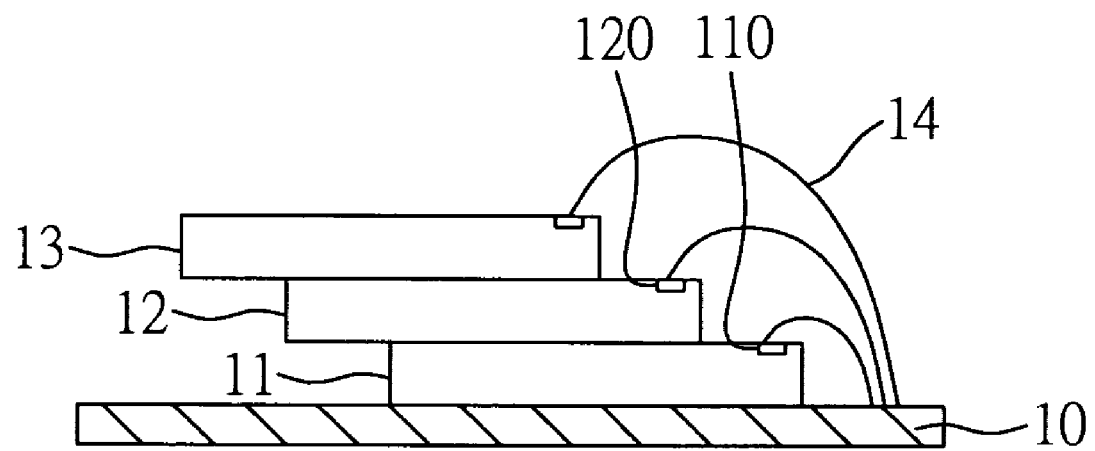
FIG. 1 (PRIOR ART) is a cross-sectional view of a multichip stacking structure disclosed by U.S. Pat. No. 6,900,528.
Figure 2A:
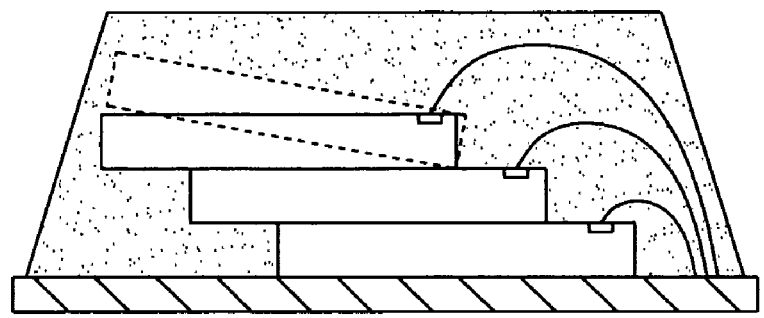
FIG. 2A (PRIOR ART) is a schematic cross-sectional diagram showing delamination of an overlying chip during a molding process in the conventional multichip stacking structure.
Figure 2B:
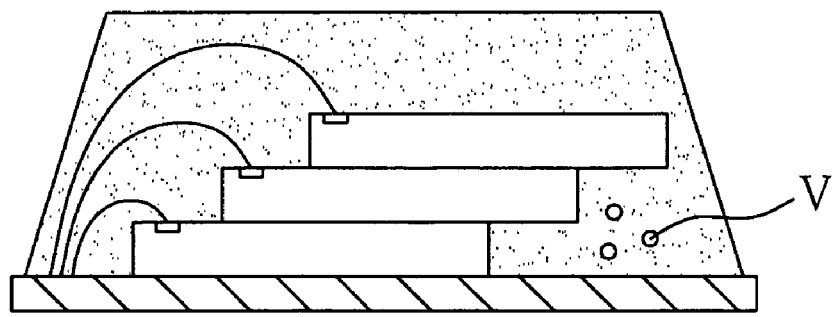
FIG. 2B (PRIOR ART) is a schematic cross-sectional diagram showing voids being formed in the molding process for the conventional multichip stacking structure.
Figure 3:
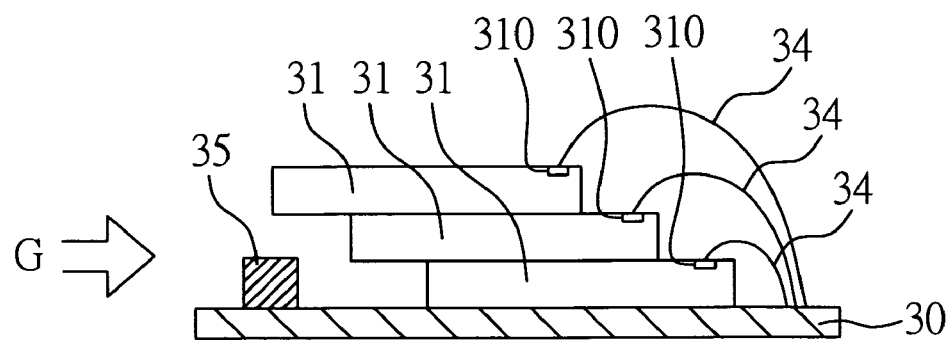
FIG. 3 is a cross-sectional view of a multichip stacking structure according to a first preferred embodiment of the present invention.

FIG. 3 is a cross-sectional view of a multichip stacking structure according to a first preferred embodiment of the present invention. As shown in FIG. 3, the multichip stacking structure comprises: a chip carrier 30; a plurality of semiconductor chips 31 stacked on the chip carrier 30 in a stepped manner that an overlying chip mounted on an underlying chip of the plurality of semiconductor chips 31 has a suspended portion free of being in contact with the underlying chip; and a bump 35 mounted on the chip carrier 30 at a position corresponding to a suspended side of the stacked semiconductor chips 31 where the suspended portion of the overlying chip is located.

The chip carrier 30 can be a substrate structure, and the plurality of semiconductor chips 31 can be flash memory chips having substantially equal surface areas, each of the semiconductor chips 31 having a plurality of bond pads 310 formed at one side of thereof. The overlying chip is stacked on the underlying chip of the plurality of semiconductor chips 31 in a stepped manner that the side having the bond pads 310 of the overlying chip is shifted by a predetermined distance away from the side having the bond pads 310 of the underlying chip and the overlying chip does not cover the bond pads 310 of the underlying chip, so as to form a step-like multichip stacking structure with the bond pads 310 being exposed, wherein the overlying chip has a suspended portion not in contact with the underlying chip and the sides having the bond pads 310 of the stacked semiconductor chips 31 are arranged at a side of the multichip stacking structure. Thereby, a wire-bonding process can be performed in one stage to form a plurality of bonding wires 34 bonded to the bond pads 310 of the semiconductor chips 31 and electrically connect the semiconductor chips 31 to the chip carrier 30 via the bonding wires 34.

In a molding process, a mold gate G is made to allow a mold flow of an encapsulating resin injected through the mold gate G to have a direction parallel to the bonding wires 34. In this embodiment, the mold gate G is located relatively distant from the bonding wires 34 and the suspended side of the stacked semiconductor chips 31 faces toward the mold gate G.

The bump 35 can be made of a discarded chip, a metal block or an insulating resin. The bump 35 is mounted on the chip carrier 30 at the position corresponding to the suspended side of the stacked semiconductor chips 31 where the suspended portion of the overlying chip is located. In addition, the bump 35 can be either positioned under the suspended region of the overlying chip or relatively close to the mold gate G.

As such, the bump 35 acts as a blocking member to prevent the mold flow of the encapsulating resin from providing direct impact on the stacked semiconductor chips 31, thereby eliminating chip delamination.

Figure 4:
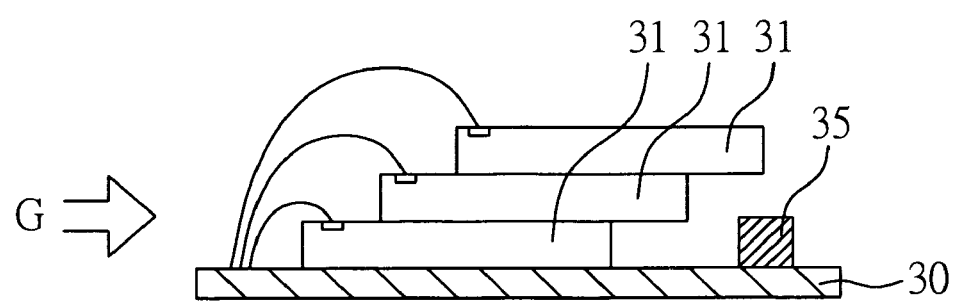
FIG. 4 is a cross-sectional view of a multichip stacking structure according to a second preferred embodiment of the present invention.

FIG. 4 is a cross-sectional view of a multichip stacking structure according to a second preferred embodiment of the present invention. The multichip stacking structure of the second embodiment is substantially similar to that of the foregoing first embodiment. A primary difference between the first and second embodiments is that in the second embodiment, the mold gate G is located relatively close to the bonding wires 34 and the suspended side of the stacked semiconductor chips 31 faces away from the mold gate G. As such, the bump 35 mounted on the chip carrier 30 at the position corresponding to the suspended side of the stacked semiconductor chips 31 can act as a filling member to prevent voids from being formed in the encapsulating resin at positions corresponding to the suspended portion of the overlying chip during the molding process.

Therefore, the multichip stacking structure of the present invention is provided with the bump on the chip carrier at the position corresponding to the suspended side of the stacked semiconductor chips. During the molding process where the mold gate is made to allow the mold flow of the encapsulating resin injected through the mold gate to have a direction parallel to the bonding wires and is located relatively close to the bonding wires, the bump acts as a filling member to prevent voids from being formed in the encapsulating resin at positions corresponding to the suspended portion of the overlying chip. On the other hand, when the mold gate is located relatively distant from the bonding wires, the bump acts as a blocking member to prevent the mold flow from providing direct impact on the stacked semiconductor chips and thereby eliminate chip delamination.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A multichip stacking structure comprising:
   a chip carrier;
   a plurality of semiconductor chips stacked on the chip carrier in a stepped manner that an overlying chip mounted on an underlying chip of the plurality of semiconductor chips has a suspended portion free of being in contact with the underlying chip; and
   a bump mounted on the chip carrier at a position corresponding to a suspended side of the stacked semiconductor chips where the suspended portion of the overlying chip is located, at least a portion of the bump being located right below the suspended portion of the overlying chip, the bump being free of contact with the semiconductor chips and free of electrical connection with the chip carrier, and positioned on the chip carrier to prevent separation of the semiconductor chips during encapsulation, wherein the semiconductor chips are electrically connected to the chip carrier via a plurality of bonding wires, and the bonding wires are parallel to a direction of a mold flow of an encapsulating resin injected through a mold gate.

2. The multichip stacking structure of claim 1, wherein the chip carrier is a substrate structure.

3. The multichip stacking structure of claim 1, wherein the semiconductor chips are flash memory chips.

4. The multichip stacking structure of claim 1, wherein each of the semiconductor chips is formed with a plurality of bond pads at one side thereof, such that the semiconductor chips are stacked on the chip carrier in the stepped manner that the overlying chip mounted on the underlying chip is free of covering the bond pads of the underlying chip.

5. The multichip stacking structure of claim 4, wherein the sides having the bond pads of the stacked semiconductor chips are arranged at a side of the multichip stacking structure, allowing the semiconductor chips to be electrically connected to the chip carrier via a plurality of bonding wires bonded to the bond pads of the semiconductor chips.

6. The multichip stacking structure of claim 1, wherein the mold gate is located distant from the bonding wires.

7. The multichip stacking structure of claim 6, wherein the suspended side of the stacked semiconductor chips faces toward the mold gate.

8. The multichip stacking structure of claim 1, wherein the mold gate is located close to the bonding wires.

9. The multichip stacking structure of claim 8, wherein the suspended side of the stacked semiconductor chips faces away from the mold gate.

10. The multichip stacking structure of claim 1, wherein the bump is made of one of a discarded chip, a metal block and an insulating resin.

* * * * *